United States Patent
Steffensmeier et al.

(10) Patent No.: US 7,498,739 B1
(45) Date of Patent: Mar. 3, 2009

(54) POLARIZED LIGHT SOURCE USING AN ORGANIC LIQUID CRYSTAL

(75) Inventors: Martin J. Steffensmeier, Cedar Rapids, IA (US); Thomas A. Seder, Northville, MI (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 458 days.

(21) Appl. No.: 10/954,531

(22) Filed: Sep. 30, 2004

(51) Int. Cl.
*H01J 63/04* (2006.01)

(52) U.S. Cl. .......................................... 313/504; 349/69

(58) Field of Classification Search ................. 313/112, 313/504, 506, 512; 349/69
See application file for complete search history.

(56) References Cited

U.S. PATENT DOCUMENTS

| | | | | |
|---|---|---|---|---|
| 5,124,824 A * | 6/1992 | Kozaki et al. | ............... | 349/120 |
| 5,256,945 A * | 10/1993 | Imai et al. | ................... | 313/504 |
| 5,399,453 A * | 3/1995 | Dohi et al. | ................. | 430/58.8 |
| 5,638,200 A * | 6/1997 | Xu | .............................. | 349/117 |
| 6,226,061 B1 * | 5/2001 | Tagusa | ........................ | 349/84 |
| 6,489,044 B1 * | 12/2002 | Chen et al. | .................... | 428/690 |
| 6,579,564 B2 * | 6/2003 | Chen et al. | .................... | 427/58 |
| 6,646,284 B2 * | 11/2003 | Yamazaki et al. | ............. | 257/40 |
| 6,750,996 B2 * | 6/2004 | Jagt et al. | ...................... | 359/34 |
| 2003/0094894 A1* | 5/2003 | Andry et al. | ................ | 313/506 |
| 2003/0099862 A1* | 5/2003 | O'Neill et al. | .............. | 428/690 |
| 2004/0109106 A1* | 6/2004 | Yang et al. | .................... | 349/69 |
| 2004/0170861 A1* | 9/2004 | Culligan et al. | ............. | 428/690 |
| 2005/0088084 A1* | 4/2005 | Cok | ........................... | 313/506 |

FOREIGN PATENT DOCUMENTS

JP          05311163 A * 11/1993
JP          09115669 A * 5/1997

* cited by examiner

*Primary Examiner*—Toan Ton
*Assistant Examiner*—Hana A Sanei (57) ABSTRACT

An organic polarized light source is provided that includes a substrate, a striated layer, and an anode formed on the substrate. The organic polarized light source further includes an organic hole transport layer formed on the anode, an organic electron transport layer formed on the hole transport layer, and a cathode formed on the electron transport layer.

4 Claims, 5 Drawing Sheets

POLARIZED LIGHT SOURCE USING AN ORGANIC LIQUID CRYSTAL

FIELD OF THE INVENTION

The present invention relates generally to a polarized light source using a liquid crystal.

BACKGROUND OF THE INVENTION

A liquid crystal display (LCD) is a very popular type of display that is used in many electronic devices. The LCD display works on a fairly low voltage DC, typically about 3 to 5 volts, and may be formed of individual pixels that may be used to generate any type of alphanumeric characters or graphics. LCDs are relatively low priced and may be incorporated in any number of devices, such as cell phones, computers, calculators, watches, gas pumps, instruments, etc.

Figure 1:
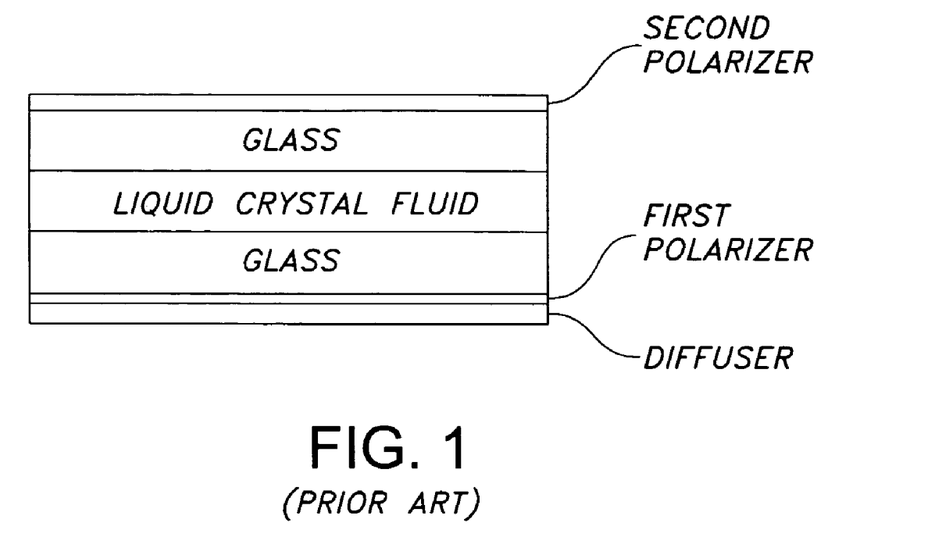
FIG. 1 shows a typical prior art LCD formed of a pair of substrates with a liquid crystal fluid therein and polarizers arranged on both sides.

FIG. 1 shows a typical prior art LCD formed of a pair of substrates (glass plates) with a liquid crystal fluid therein and polarizers arranged on both sides. The glass or substrate is coated with a transparent metal coating which forms the electrodes of the display. The transparent metal coating may be any type of thin conducting material layer, such as gold, silver or tin. A popular choice is indium tin oxide (ITO). The inner surface of each plate is coated with a thin polymeric alignment layer, which is striated to give the liquid crystal molecules a preferred direction of orientation. Because the liquid crystal molecules are long-chain molecules, the striations cause the liquid crystal molecules to be aligned in a predetermined direction substantially aligned with the striations in the substrate. The LCD is formed with two substrates having striations running in different directions, such as 90 degrees, for example. The helical structure is therefore a rotation or twist of the liquid crystal molecules from one substrate to the other. In a nematic LCD, the twist is 90 degrees. In a supertwisted nematic LCD, the twist may be greater than 90 degrees.

As the polarized light from a first polarizer passes through an un-energized (off) display, it will be rotated 90 degrees by the liquid crystal and may be either absorbed or passed by the second polarizer. When the LCD is energized (on), the liquid crystal molecules will rotate in the direction of the electric field and no longer rotate the polarized beam of light. Again, depending on the direction of the second polarizer, the light will be either absorbed or passed. In the case of a positive image or reflective display, this would produce a dark character on a light background. The electric field therefore may be used to selectively block or transmit light. A display may be formed of a plurality of LCD pixels or alphanumeric symbols, with each pixel or symbol being an independently controllable LCD unit.

A drawback of LCDs is that, since they do not generate light, they suffer from a relatively poor contrast and are not highly visible. Therefore, LCDs require backlighting in order to provide high contrast and viewability. In a backlit LCD, a light source is positioned behind the LCD with the light passing through a diffuser, through the first polarizer, through the LCD itself, and then through the second polarizer. A prior art LCD must include a polarizer on both sides in order to function correctly. The diffuser is used to diffuse the light from the backlighting light source into the display itself. The diffuser is employed because prior art backlit LCDs typically use a non-uniform light source for backlighting. Without a diffuser, a prior art backlit LCD would therefore exhibit area luminance non-uniformity.

Popular reasons that LCDs enjoy increasing use include small size, low power consumption and low cost. LCDs are thin and light, relative to CRT type of displays. Therefore, laptop computer use is an area in which LCDs are widely used. Also, they require less power and are generally less expensive than other types of displays, such as CRTs, for example.

Figure 2:
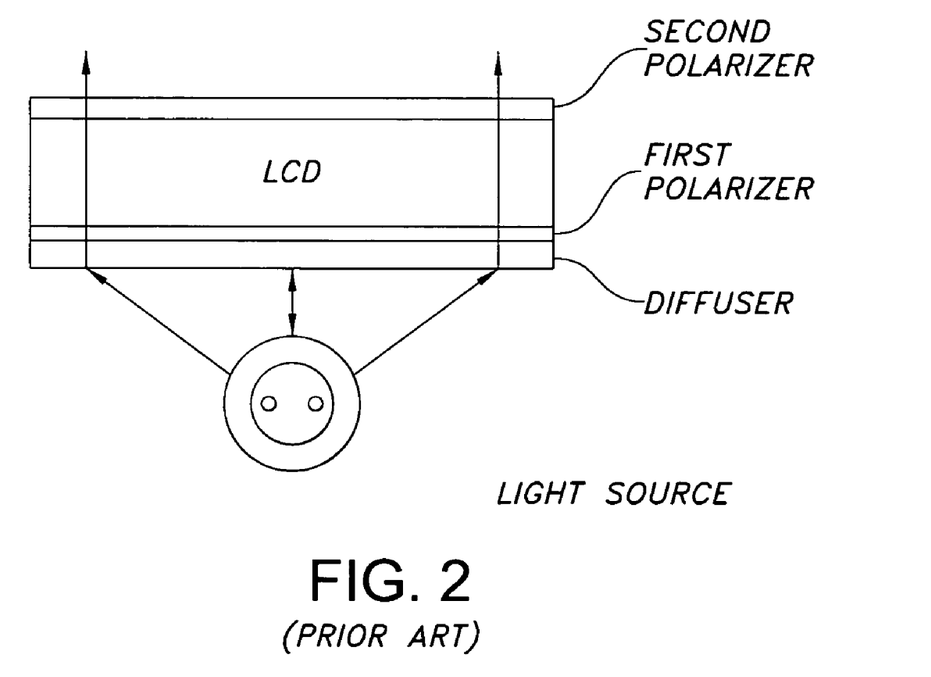
FIG. 2 shows a prior art backlight arrangement using a fluorescent light source.

FIG. 2 shows a prior art backlight arrangement using a fluorescent lamp light source. Because the fluorescent lamp is a line light source, a diffuser is used to provide uniformity of light prior to input into the LC display. The fluorescent lamp is generally spaced apart from the diffuser in order to increase the diffusion of light without excessive losses. In addition, the spacing may reduce heating of the diffuser, and may prevent contact and damage due to shock or vibration of the display. This spacing contributes to the physical size of the display.

In another drawback of the prior art, the first polarizer is interposed between the diffuser and the LCD. The first polarizer is needed because the fluorescent bulb produces unpolarized light. The first polarizer polarizes the light entering the LCD.

Figure 3:
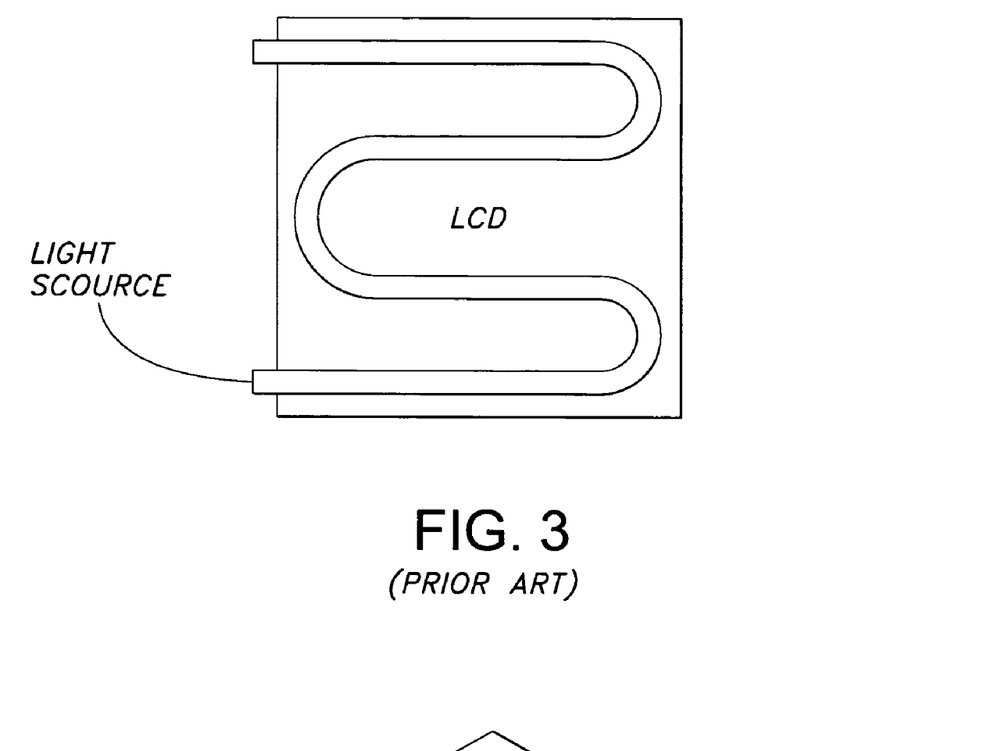
FIG. 3 shows another prior art backlit LCD embodiment wherein in order to reduce the dependence on the diffuser the light source is a fluorescent lamp of a serpentine configuration.

FIG. 3 shows another prior art backlit LCD embodiment wherein, in order to reduce the dependence on the diffuser, the light source is a fluorescent bulb of a serpentine configuration. Alternatively circular or multiple line fluorescent sources have been used in order to attempt a more uniform light source. The diffuser and polarizers are still required.

Figure 4:
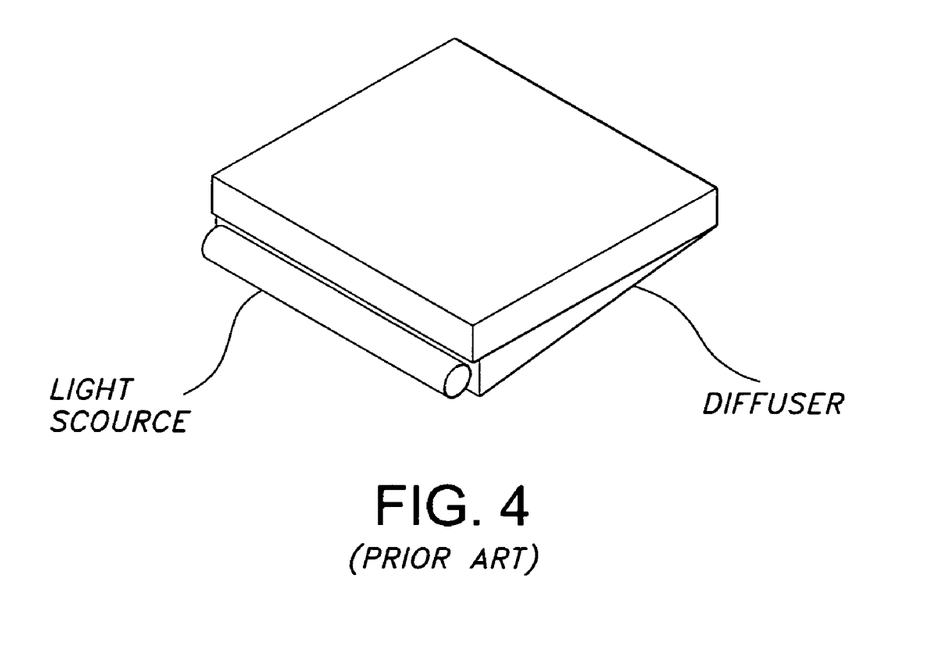
FIG. 4 shows an edge lit LCD backlight configuration where the fluorescent light source is positioned along an edge of the display.

FIG. 4 shows an edge lit LCD backlight configuration where the fluorescent light source is positioned along an edge of the display. A light pipe, such as an internally reflective wedge of acrylic, is used to diffuse the light and to conduct the light from the fluorescent bulb into the LCD display. The diffuser and polarizers are still required.

The prior art suffers from many drawbacks. Light loss is the largest drawback. First, the fluorescent lamp based system is inherently non-uniform. Therefore, a diffuser section is required in the prior art. However, the diffuser does not capture and redirect all light from the light source and therefore not all of the light generated by the light source actually enters the diffuser. In addition, a diffuser of the prior art, such as for avionics displays, passes only about 50 percent of the entering light. The diffuser section adds weight and thickness to the LCD display. Second, the prior art light source is unpolarized (the emitted light contains waves of all possible orientations) and a large amount of light is lost in the first polarizer. A typical polarizer, such as a film type used in LCDs, passes only about 38% to 40% of the entering light. A twisted nematic LCD requires the second polarizer to ensure that only the light of a desired orientation passes out of the LCD.

Therefore, in a prior art backlit LCD display, only about 4% of the light produced by the light source actually is transmitted completely through the LCD. The prior art backlit LCD is highly inefficient and most of the light produced for the backlighting is simply wasted. This results in a waste of energy, generation of unnecessary heat, etc.

Another prior art drawback is the size typically required for a fluorescent backlighting arrangement. Prior art avionics devices may add up to 4 inches in depth by including a fluorescent light source and a diffuser or light pipe.

Another drawback of the prior art comes from the nature of the fluorescent light source. Fluorescent light sources require high voltage, alternating current, and produce significant electromagnetic interference (EMI), and must produce a high light output in order to make the backlit LCD function properly and have adequate contrast and visibility.

What is needed, therefore, are improvements to light sources.

SUMMARY OF THE INVENTION

According to one embodiment of the invention, an organic polarized light source comprises a substrate, a striated layer, and an anode formed on the substrate. The organic polarized light source further comprises an organic hole transport layer formed on the anode, an organic electron transport layer formed on the hole transport layer, and a cathode formed on the electron transport layer.

According to another embodiment of the invention, a method of forming an organic polarized light source comprises the steps of providing a substrate, providing a striated layer, and providing an anode formed on the substrate. The method further comprises the steps of providing an organic hole transport layer formed on the anode, providing an organic electron transport layer formed on the hole transport layer, and providing a cathode formed on the electron transport layer.

According to yet another embodiment of the invention, a method of forming an organic polarized light source comprises the steps of providing a substrate, providing a striated layer, and providing an anode formed on the substrate. The method further comprises the steps of providing an organic hole transport layer formed on the anode, providing an organic electron transport layer formed on the hole transport layer, and providing a cathode formed on the electron transport layer. The method further comprises the steps of providing a liquid crystal element formed on the polarized light source and providing a first polarizer formed on the liquid crystal element. Light emitted from the organic hole transport layer and from the organic electron transport layer passes through the liquid crystal element and then through the first polarizer. The polarized light source therefore operates as a backlight for the liquid crystal element.

The above and other features and advantages of the present invention will be further understood from the following description of the preferred embodiments thereof, taken in conjunction with the accompanying drawings.

DETAILED DESCRIPTION

Figure 5:
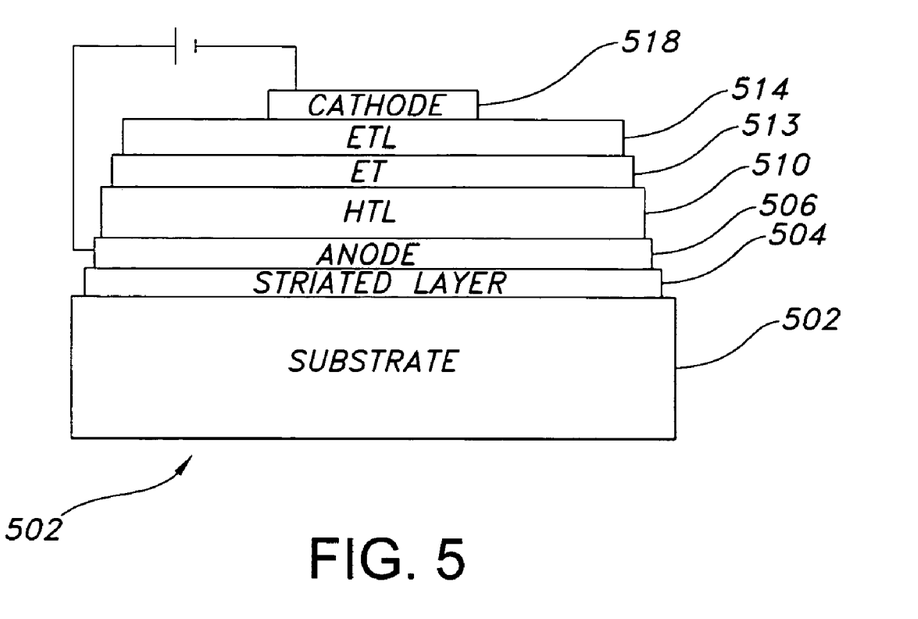
FIG. 5 shows an organic LED polarized light source and the layers thereof.

FIG. 5 shows an organic light emitting diode (OLED) polarized light source 500 and the layers thereof. The organic LED 500 may include a substrate 502, a striated layer 504, an anode 506, an organic hole transport layer (HTL) 510, an optional organic emitter layer (EL) 513, an organic electron transport layer (ETL) 514, and a cathode 518.

The organic LED 500 is formed of carbon or carbon compounds. This is in contrast to common semiconductor LEDs that are formed primarily of non-organic compounds. Alternatively, the organic LED 500 may be referred to as a polymer LED. A polymer is a long-chain compound formed by polymerization and is therefore formed of repeating structural units (monomers). Consequently, the terms organic and polymer may be used in referring to such a device and are encompassed by the invention. However, a polymer is distinct from an organic material in that a polymer is formed of long-chain organic molecules, while an organic material may be formed of molecules of any size.

Organic compounds have the benefit of being cheaper to fabricate than conventional crystalline semiconductor materials. Organic devices are easier to deposit, can be easily patterned onto very large surfaces, and can be formed on flexible substrates.

Fabrication of the organic LED 500 of the first embodiment may be done by any known method. The monomer components can be delivered onto the substrate 502 after being dissolved in a solvent. The monomers may then be cast into a solid film as the solvent evaporates. Alternatively, layers of the organic LED 500 may be formed by spin coating, meniscus coating, vapor deposition, or any other film deposition technique. The organic LED 500 may be encapsulated or edge sealed in order to protect the polymer material from moisture and oxygen.

The substrate 502 may be any type of transparent substrate, such as, for example, glass or plastic. A plastic substrate 502 may allow the organic LED 500 to bend and flex, and is lighter than a glass substrate. The limitation on a plastic substrate 502 is that the substrate 502 cannot be very permeable and must prevent oxygen and moisture from reaching the polymer layers 510, 513, and 514. In an alternative embodiment, the substrate 502 is not transparent but is merely translucent or opaque.

The anode 506 is the hole injecting electrode, and may be formed of any suitable transparent metal. A commonly used material for the anode 506 is indium tin oxide (ITO). The anode material may additionally include introduction of oxygen during sputter deposition in order to improve hole injection. Likewise, copper phthalocyanine (CuPc) also may improve hole injection. In addition, a layer of silicon dioxide ($SiO_2$) may be formed between the anode 506 and the hole transport layer 510, and has been shown to greatly increase the brightness and efficiency of the organic LED 500.

The striated layer 504 may comprise a multitude of aligned ridges and furrows that dictate the alignment of any layers subsequently deposited onto the striated layer 504. It should be noted that the striated layer 504 may be located between the substrate 502 and the anode 506, as shown, or alternatively may be located between the anode 506 and the hole transport layer 510.

The striated layer 504 may comprise polyamide, wherein the striations are formed by rubbing the striated layer 504. Alternatively, the striated layer 504 may comprise polyvinyl, wherein the striations are formed by stretching a polyvinyl film to align the molecules of the striated layer 504.

In another alternate embodiment, the striated layer 504 is formed by photo-alignment, wherein polarized UV light is used to align the molecules of the striated layer 504 while it is in a liquid phase, with the alignment being retained in the striated layer 504 when it transforms into a solid phase.

The hole transport layer 510 is formed on the striated substrate 502 or on the anode 506, with the organic molecules tending to be aligned initially by the striations. Subsequent organic molecules tend to be aligned by previous organic molecules. The result is an organic layer or layers having substantially aligned and substantially coaxial molecules (the hole transport layer 510, the emitter layer 513, and the electron transport layer 514 may be thus formed). When excited by an electrical field, the substantially aligned and substantially coaxial organic molecules emit substantially polarized light.

The hole transport layer 510 is typically based on aromatic amides, which exhibit high hole mobility. Two materials which are commonly used are TPB and NPB. The NPB material has a glass transition temperature $T_g$ which is approximately 30 degrees Centigrade higher than the $T_g$ of TPB. This higher $T_g$ results in better thermal stability performance for NPB, at a tradeoff of being much more expensive. Alternatively, the hole transport layer 510 may be formed of functionalized polymers with TPB side-groups. These have high glass transition temperatures and can form pin-hole free films. These materials are stable and can achieve a bright output from the organic LED 500. The improved stability has been attributed to the higher ionization potential of the hole transport layer 510.

The hole transport layer 510 may additionally be formed of more than one layer. A bilayer hole transport layer 510 has been shown to have an improved performance over a single layer hole transport layer 510. In this approach, a material which improves the hole injection at the interface of the anode 506 and the hole transport layer 510 is deposited between the anode 506 and the TPB or NPB material of the hole transport layer 510. Materials which may be used are, for example, 1-TNATA, m-MTDATA, or triphenyl diamine (TPB).

The electron transport layer 514 may be formed of a number of organic materials. The most common material is $Alq_3$ based, with $Alq_3$ being the most common. Normally, this material emits green light, but if it is doped with DCM or DCJT, it will emit red light. TPP and $EU(TTFA)_3Phen$ may also be used as red emitters. Blue emitters include $Alq_2Oph$, $Zn_2(oxz)_3CL$, and OXD-8. A RGB (red-green-blue) emitter can be based entirely on $Alq_3$ by using different dopants (CDJT for red, Coumarin 6 for green, and Perylene for blue). Alternatively, the electron transport layer 514 may be formed of poly (3-hexyl thiophene), also known as PHT, or 8-hydroxyquinolinato aluminum. Other organic materials may also be used for light emission.

The cathode 518 may be formed of any suitable material, such as, for example, ITO. Alternatively, the cathode 518 may be formed of a low work function metal such as calcium or zinc oxide, for example. The cathode 518 may be capped with an inert metal like gold, nickel, or aluminum in order to improve conductivity. In addition, any type of metal plating layer may be placed over the cathode in order to improve conductivity (discussed below in conjunction with FIG. 9).

The emitter layer 513 may be formed of any suitable materials such as 5,12-Dihydro-5,12-dimethylquino[2,3-b]acridine-7,14-dione (DMQA); 10-(2-Benzothiazolyl)-2,3,6,7-tetrahydro-1,1,7,7-tetramethyl-1H,5H,11H-(1)-benzopyropyrano(6,7-8-i,j)quinolizin-11-one; 4-(Dicyanomethylene)-2-t-butyl-6-(1,1,7,7-tetramethyljulolidyl-9-enyl)-4H-pyran (DCJTB); 4-(Dicyanomethylene)-2-isopropyl-6-(1,1,7,7-tetramethyljulolidyl-9-enyl)-4H-pyran (DCJTI); or Bis(2-methyl-8-quinolinolato-N1,O8)-(1,1'-Biphenyl-4-olato)aluminum (Balq). Other similar materials may also be suitable as well.

In operation, the electrical current injected from the cathode 518 into the organic layers 510, 513, and 514 takes the form of negatively charged particles, while the current injected from the anode 506 consists of positively charged particles, which travel through the organic layers 510, 513, and 514 until they encounter the negative particles. When the two meet, the recombination creates excited states called singlet or triplet excitons. Some of the singlet excitons decay to the ground state by nonradiative processes, but some decay radiatively, emitting light.

In one example, an ITO anode 506 may be coated onto a glass substrate 502 (using a mask, for example). Individual pixels of the organic LED 500 may be defined by using a 193 nanometer Argon Fluorine (ArF) excimer laser to ablate rows in the ITO anode 506. A light emitting organic compound may then be spin coated onto the patterned ITO. Next, aluminum may be evaporated onto the organic compound layers and may then be patterned into columns (perpendicular to the ITO traces) with the ArF excimer laser. This procedure may remove the aluminum and part of the underlying polymer layer. Pixels may be formed at the areas which were not laser ablated in either the anode (ITO) or cathode (aluminum) processing steps.

In another example, the polarized organic LED 500 may be formed of aligned molecular emitters through vapor deposition of emitters onto rubbed substrates (i.e., onto the hole transport layer 510 or onto the electron transport layer 514). Alternatively, the emitter material may be formed of low molecular weight versions of poly(p-phenylene vinylene), PPV.

Figure 6:
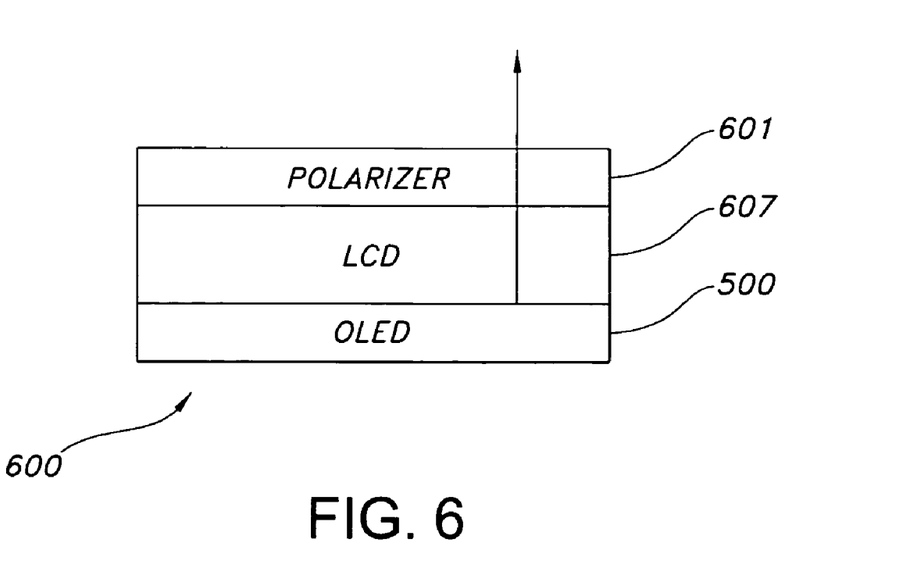
FIG. 6 shows a first embodiment of a backlit LCD according to the invention.

FIG. 6 shows a first embodiment of a backlit LCD 600 according to the invention. The backlit LCD 600 includes a first polarizer 601, an LCD 607, and a polarized light source (i.e., the organic LED 500). Light generated by the organic LED 500 passes through the LCD 607 and then through polarizer 601 and thereby provides backlighting for the LCD 607.

The organic LED 500 emits substantially full color light. In addition, the organic LED 500 may emit substantially polarized light. Because the organic LED 500 may emit substantially polarized light, there is no need for a second polarizer interposed between the LCD 607 and the organic LED 500. In addition, because the organic LED 500 is a substantially uniform light source, there is also no need for a diffuser. This is significant because a diffuser does not transmit all of the entering light. A diffuser designed to diffuse a point or line light source is typically designed to have diffusion properties that allow transmission of only about 50 percent of the entering light. Therefore, the ability of the invention to function without a diffuser improves the overall efficiency of the LCD 607 and backlight.

Because the polarizers and diffusers of the prior art pass through only about 4% of the light from the backlight, there is much room for improvement. In the embodiment shown with only one polarizer, approximately 19% of the light will pass through the display. This is an almost five-fold improvement in efficiency over LCD backlighting of the prior art.

The polarized light emission property may be formed in the organic LED 500 by including the striated layer 504, as previously discussed. The striations or grooves of the striated layer 504 induce the long-chain polymer molecules and small organic molecules into a substantially aligned arrangement (the hole transport layer 510, the emitter layer 513, and the electron transport layer 514 may be formed in this manner by deposition onto the striated layer 504). The organic molecules will therefore be substantially aligned and will emit substantially polarized light when they are current stimulated. This eliminates the need for a second polarizer interposed between the LCD 607 and the organic LED 500. Because an interposed polarizer transmits or passes through only about forty percent of entering light, the invention results in a much more efficient LCD and backlight. The result of using a substantially polarized light source for LCD backlighting is an improved visibility, a lower power consumption, a lower operating temperature and a longer operating life.

The LCD and backlight of the invention may be implemented with both twisted nematic, supertwisted nematic, or any other mode LCD that uses polarized light. In addition, the LCD and backlight of the invention may be implemented with both positive and negative image LCDs, and with both transmissive LCDs (LCDs that use backlighting to provide the illumination for the display) and transflective LCDs (LCDs that use both ambient lighting and backlighting). Furthermore, the invention may be used with both passive LCDs and active matrix LCDs. An active matrix LCD display may further include thin film transistors (TFTs) formed on the organic LED 500, as is known in the art. The TFTs may drive individual pixels of the display.

As research and development on organic LEDs progresses, there are indications that organic LEDs will be able to produce light at an efficiency of about 70 lumens per watt, which is comparable to the peak efficiency of a fluorescent lamp. Therefore, since the diffuser and polarizer have been eliminated, a polarized light source backlight as shown in the invention will be far more efficient than the backlighting of the prior art. This results in a lower power consumption, thinner displays, and simpler display construction and manufacture. In addition, because of less heat generated by the backlighting, the LCD and backlight of the present invention is more reliable. Furthermore, due to the amounts of mercury used in fluorescent bulbs, the LCD and backlighting of the invention is more environmentally safe and desirable.

It should be noted that in a further improvement, the organic LED 500 may be formed directly onto an outer surface of one of the two substrates of the LCD 607. The organic LED 500 therefore does not need an additional, independent substrate, allowing even greater weight savings.

Figure 7:
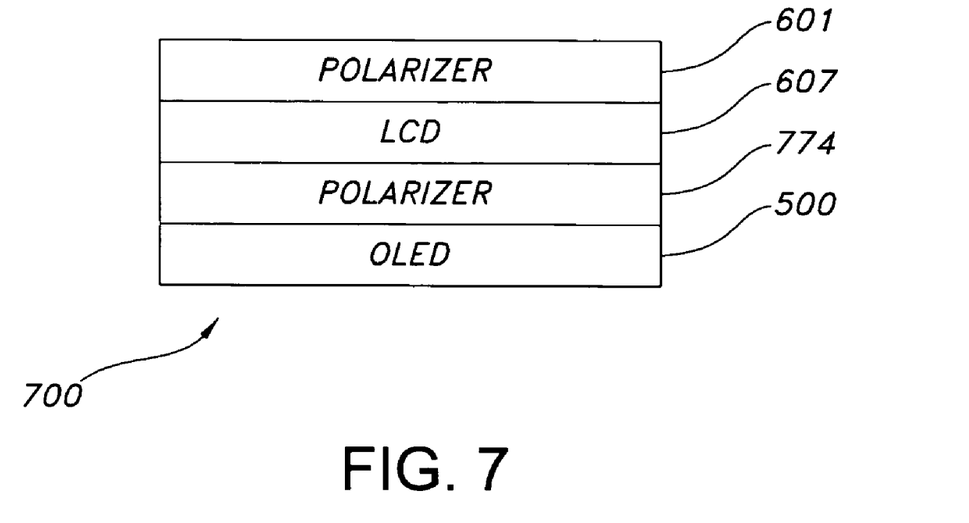
FIG. 7 shows a second embodiment of a backlit LCD according to the invention.

FIG. 7 shows a second embodiment of a backlit LCD 700 according to the invention. In this embodiment, the backlit LCD 700 includes a first polarizer 601, the LCD 607, a second polarizer 774, and the organic LED polarized light source 500. The additional second polarizer 774 is interposed between the LCD 607 and the organic LED 500. The second polarizer 774 may be used to ensure that all of the light entering the LCD 607 is polarized. This may be done even though the organic LED 500 emits substantially polarized light. However, there still may be a small component of non-coherent light that may be removed by the second polarizer 774. Because substantially polarized light is generated by the organic LED 500, however, the light loss in the second polarizer 774 will be small.

Figure 8:
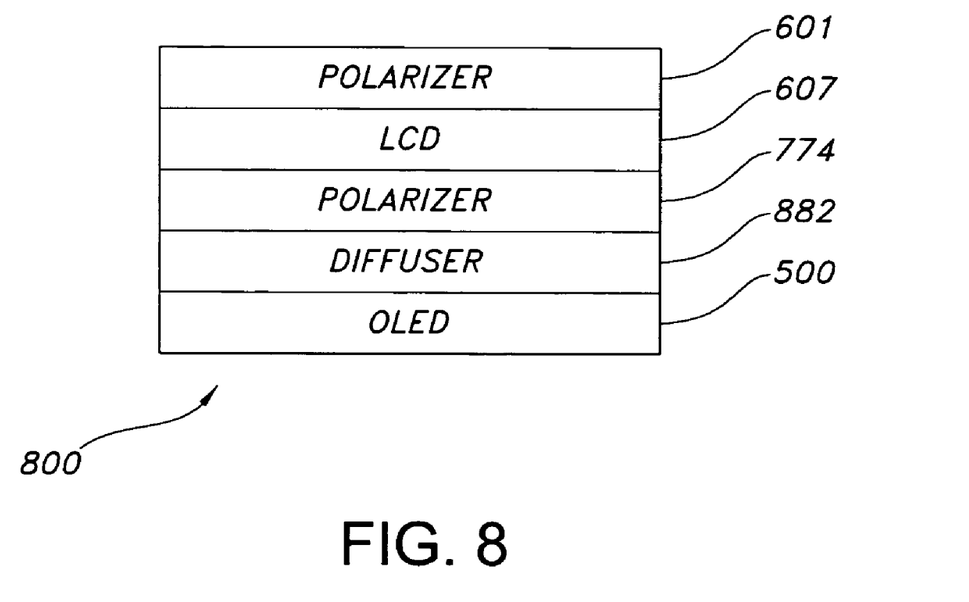
FIG. 8 shows a third embodiment of a backlit LCD according to the invention.

FIG. 8 shows a third embodiment of a backlit LCD 800 according to the invention. In this embodiment, the backlit LCD 800 additionally includes a diffuser 882 that is interposed between the LCD 607 and the organic LED 500. In a preferred embodiment, the diffuser 882 is placed between the second polarizer 774 and the organic LED 500. The diffuser 882 may be included to ensure that light uniformly passes from the organic LED 500 into the second polarizer 774 and the LCD 607. The diffuser 882 is preferably a highly transmissive diffuser that minimally impacts the efficiency of the backlit LCD 800. In a preferred embodiment, the diffuser 882 passes greater than about 50 percent of the entering light.

Figure 9:
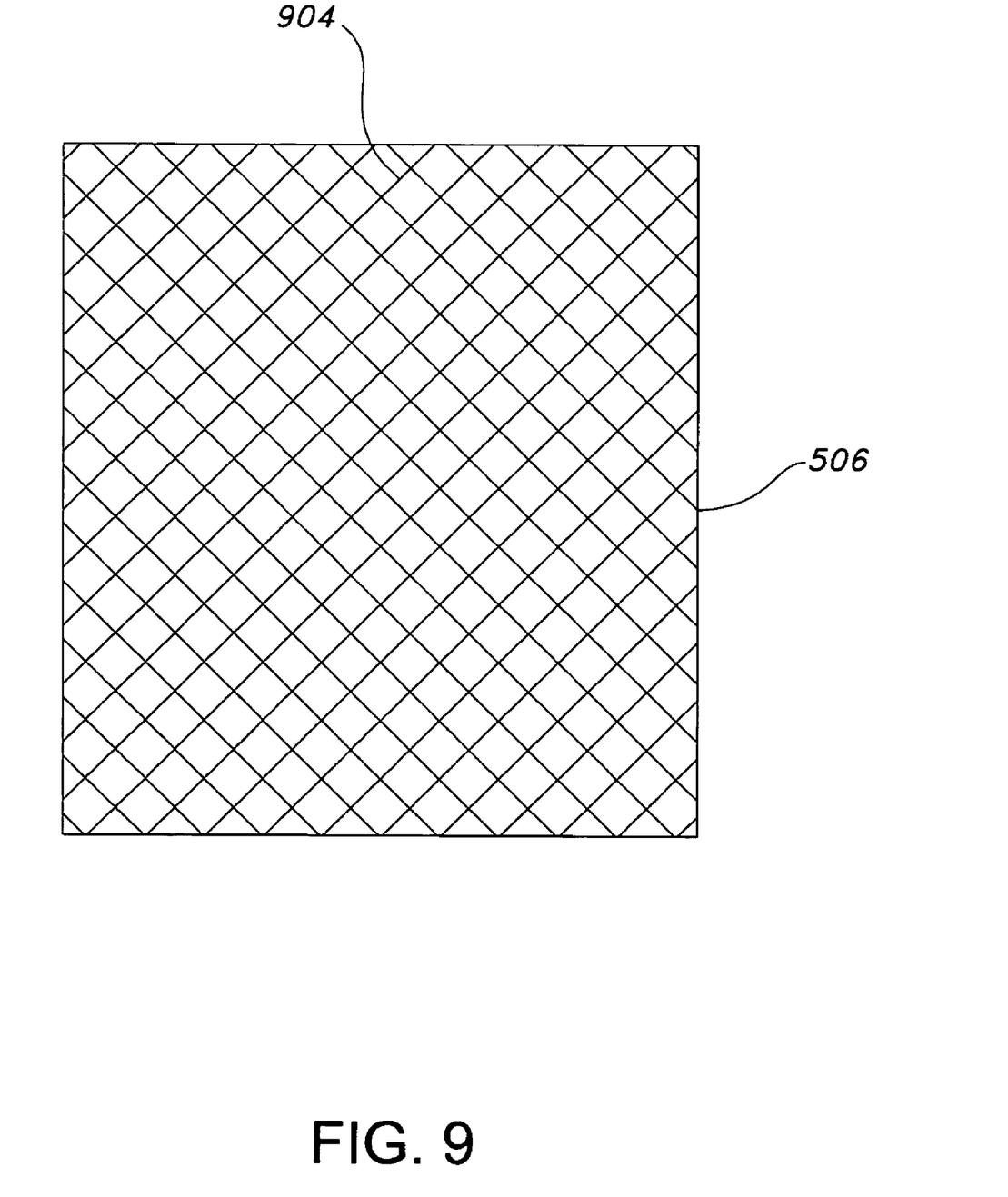
FIG. 9 shows an improved anode formed with a patterned metal conductive mesh thereon.

FIG. 9 shows an improved anode 506 formed with a patterned metal conductive mesh 904 thereon. If the anode 506 is made of a material such as ITO, the impedance may be higher than desired (in order to minimize fabrication cost). If a non-uniformity exists in the material of the anode 506, or if it is desired to keep the anode 506 thin for purposes of heat transfer, the conductive mesh 904 of the invention provides an improved operation. The conductive mesh 904 ensures an even conduction of electricity to the anode 506 in order to improve performance of the organic LED 500. It should be noted that a conductive mesh may also be formed on the cathode (the traces may be formed fine enough to be invisible).

The conductive mesh 904 may be formed according to any predetermined pattern. For example, the conductive mesh 904 may be formed of two or more sets of parallel, intersecting traces. The sets of traces may be orthogonal, or may intersect at any desired angle. In addition, individual traces do not need to form straight lines, and may be formed in curved, zigzag, or other patterns, including regular and irregular patterns. The traces may be of any width, but are preferably small, on the order of 1 to 10 microns in width. Preferably, the traces are wider if fewer traces are formed.

The conductive mesh 904 is preferably formed between the electron transport layer 514 and the anode 506, although alternatively the conductive mesh 904 may be formed on the outside of the anode 506.

An LED backlight according to any embodiment of the invention provides backlighting to a LCD display while doing so much more efficiently than the prior art. A substantially uniform light source, such as an LED, ensures that substantially all of the generated light enters the LCD display 607. This is the first way in which the invention improves over the prior art by not generating unused light. A diffuser 882 may therefore be unnecessary. If a diffuser 882 is nonetheless used, it may be much more highly transmissive than a diffuser employed in the prior art, such as a highly transmissive diffuser that passes more than about fifty percent of entering light.

A second way in which the invention improves over the prior art is by employing an organic LED 500 that emits substantially polarized light. The second polarizer 774 is therefore unnecessary. If the second polarizer 774 is nonetheless used, much less light is lost than in the prior art, as the generated light is already substantially polarized and therefore only a small percentage of light will not be transmitted through the second polarizer 774.

It should be understood that even if the organic LED 500 does not have an efficiency of 50 lumens per watt, as in fluorescent lights of the prior art, the backlit LCD of any embodiment of the invention may still enjoy a greater efficiency, as substantially all of the generated light enters the LCD 607.

While the invention has been described in detail above, the invention is not intended to be limited to the specific embodiments as described. It is evident that those skilled in the art may now make numerous uses and modifications of and departures from the specific embodiments described herein without departing from the inventive concepts.

We claim:

1. A LCD, comprising:
    an organic polarized light source, said organic polarized light source comprising a substrate, a striated layer, an anode formed on said substrate, an organic hole transport layer formed on said anode, an organic electron transport layer formed on said hole transport layer, and a cathode formed on said electron transport layer, wherein the organic hole transport layer is formed of aromatic amides, the organic hole transport layer and the organic electron transport layer have substantially aligned and substantially coaxial molecules, and the organic polarized light source is one selected from encapsulated and edge sealed;

a conductive mesh formed on said anode, said conductive mesh being formed of a predetermined pattern of crossing traces;

a liquid crystal element coupled with said organic polarized light source; and a single polarizer coupled with said liquid crystal element, wherein light emitted from said organic polarized light source passes through said liquid crystal element and then through said single polarizer, wherein said organic polarized light source operates as a backlight for said liquid crystal element, wherein said organic hole transport layer and said organic electron transport layer comprise small molecule organic compounds, and wherein approximately at least ten percent of said light emitted from said organic hole transport layer and from said organic electron transport layer passes through said LCD.

2. The LCD of claim 1, wherein said striated layer is located between said substrate and said anode.

3. The LCD of claim 1, wherein said striated layer is located between said anode and said hole transport layer.

4. The LCD of claim 1, wherein said conductive mesh is more conductive than said anode.

* * * * *